United States Patent [19]

Choi

[11] Patent Number: 5,744,286
[45] Date of Patent: Apr. 28, 1998

[54] POLYIMIDE PATTERNING

[76] Inventor: Jin-o Choi, 253 Wyeth Dr., Getzville, N.Y. 14068

[21] Appl. No.: 599,915

[22] Filed: Feb. 12, 1996

[51] Int. Cl.$^6$ .................................. G03F 7/30; G03F 7/40
[52] U.S. Cl. .......................... 430/326; 430/156; 430/166; 430/312; 430/330
[58] Field of Search ..................... 430/326, 330, 430/156, 166, 312

[56] References Cited

U.S. PATENT DOCUMENTS

| | | | |
|---|---|---|---|
| 5,177,181 | 1/1993 | Rosenfeld et al. | 528/353 |
| 5,393,864 | 2/1995 | Summers | 528/353 |

OTHER PUBLICATIONS

Article by Toyhiko Abe et al. in J. Photopolym. Sci. Technol. 5(2), 327–34 (1992).

*Primary Examiner*—John S. Chu
*Attorney, Agent, or Firm*—Richard D. Fuerle; Arthur S. Cookfair

[57] ABSTRACT

Disclosed is a method of making a polyimide pattern on a substrate. A solution is prepared in an organic solvent of a polyamic acid and about 1 to about 10 wt. % of a photosensitizer that becomes more water soluble when exposed to actinic light. A coating is formed of the solution on a substrate and solvent is evaporated from the coating. A positive photoresist is applied over the coating and is exposed to a pattern of actinic light. The exposed portions of the photoresist are removed as well as the exposed portions of the polyamic acid coating thereunder. The remaining photoresist is removed and the polyamic acid coating is imidized.

20 Claims, 4 Drawing Sheets

POLYIMIDE PATTERNING

BACKGROUND OF THE INVENTION

This invention relates to a method of making a polyimide pattern on a substrate and to the resulting article. In particular, it relates to the inclusion of a photosensitive system in a polyamic acid solution deposited on a substrate from which a polyimide pattern is made.

Polyimides are used in the semiconductor industry for many application, such as dielectric coatings on silicon chips. In some applications, it is necessary to form a pattern of a polyimide coating on a substrate. One method by which this can be accomplished is to prepare a solution in an organic solvent of a polyamic acid, apply the solution to the substrate, and evaporate the solvent. A positive photoresist is applied over the solid coating and the photoresist is exposed to UV light through a mask. The exposed portions of the photoresist and those portions of the polyamic acid coating underneath are removed using an aqueous base developer. After the remaining photoresist is removed in an organic solvent, the polyamic acid is cured to form a polyimide coating. (See, for example, U.S. Pat. No. 5,393,864, herein incorporated by reference.)

While this process works well, the removal of portions of the polyamic acid coating can result in severely sloped sidewalls, i.e., polyamic acid can be removed in the isotropic direction that is not directly under the photoresist that was exposed to UV light. Severe isotropic developing can create problems such as poor resolution or patterns that have severely sloped sidewalls.

SUMMARY OF THE INVENTION

I have discovered that the isotropic developing of the polyamic acid coating patterns can be reduced if a photosensitive system that becomes more soluble in the aqueous base developer when exposed to UV light is mixed in with the polyamic acid. The UV light passes through the photoresist layer and renders the exposed portions of the polyamic acid coating more soluble in the developer. When UV-exposed photosensitizer in the polyamic acid coating is removed using the developer, the exposed portion of the coating dissolves more readily. This controls the development time and the sidewall slope.

BRIEF DESCRIPTION OF THE DRAWINGS

In FIG. 3, no photosensitizer was used and in FIG. 4, 10 wt. % photosensitizer was used.

DESCRIPTION OF THE PREFERRED EMBODIMENTS

Figure 1:
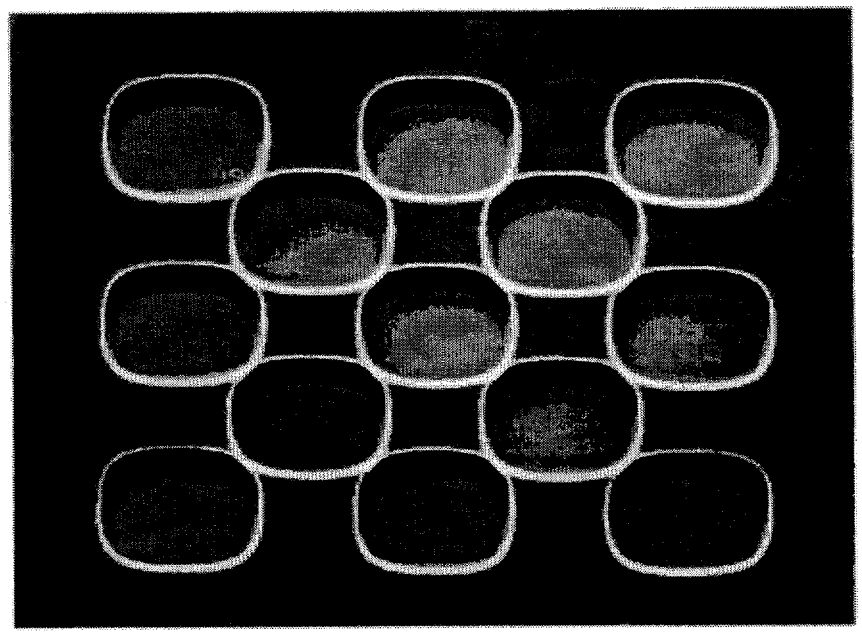
FIG. 1 is a scanning electron micrograph (SEM) of the developed film made in Example 1.

In the first step of the process of this invention, a solution is prepared of a polyamic acid in an organic solvent. The polyamic acid is the reaction product of a dianhydride and a diamine. Generally, stoichiometric quantities of diamine and dianhydride are used to obtain the highest molecular weight polyamic acid, but the equivalent ratio of dianhydride to diamine can range from 1:2 to 2:1. Examples of suitable dianhydrides include:

1,2,5,6-naphthalene tetracarboxylic dianhydride;
1,4,5,8-naphthalene tetracarboxylic dianhydride;
2,3,6,7-naphthalene tetracarboxylic dianhydride;
2-(3',4'-dicarboxyphenyl ) 5,6-dicarboxybenzimidazole dianhydride;
2-(3',4'-dicarboxyphenyl) 5,6-dicarboxybenzoxazole dianhydride;
2-(3',4'-dicarboxyphenyl) 5,6-dicarboxybenzothiazole dianhydride;
2,2',3,3'-benzophenone tetracarboxylic dianhydride;
2,3,3',4'-benzophenone tetracarboxylic dianhydride;
3,3',4,4'-benzophenone tetracarboxylic dianhydride (BTDA);
2,2',3,3'-biphenyl tetracarboxylic dianhydride;
2,3,3',4'-biphenyl tetracarboxylic dianhydride;
3,3',4,4'-biphenyl tetracarboxylic dianhydride(BPDA);
bicyclo-[2,2,2]-octen-(7)-2,3,5,6-tetracarboxylic-2,3,5,6-dianhydride;
thio-diphthalic anhydride;
bis (3,4-dicarboxyphenyl) sulfone dianhydride;
bis (3,4-dicarboxyphenyl) sulfoxide dianhydride;
bis (3,4-dicarboxyphenyl oxadiazole-1,3,4) paraphenylene dianhydride;
bis (3,4-dicarboxyphenyl) 2,5-oxadiazole 1,3,4-dianhydride;
bis 2,5-(3',4'-dicarboxydiphenylether) 1,3,4-oxadiazole dianhydride;
bis (3,4-dicarboxyphenyl) ether dianhydride or oxydiphthalic anhydride (ODPA);
bis (3,4-dicarboxyphenyl) thioether dianhydride;
bisphenol A dianhydride;
bisphenol S dianhydride;
2,2-bis (3,4-dicarboxyphenyl) hexafluoropropane dianhydride or 5,5-[2,2,2-trifluoro-1-(trifluoromethyl) ethylidene]bis-1,3-isobenzofurandione) (6FDA);
hydroquinone bisether dianhydride;
bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhydride;
perylene 3,4,9,10-tetracarboxylic dianhydride;
pyromellitic dianhydride (PMDA);
tetrahydrofuran tetracarboxylic dianhydride; and
resorcinol dianhydride.

The preferred dianhydrides are PMDA, BPDA, BTDA, and ODPA or mixtures thereof, as these dianhydrides are readily available and give a polyimide having better thermal, mechanical, and adhesive properties.

The dianhydrides can be used in their tetraacid form or as mono, di, tri, or quatra esters of the tetra acid, but the dianhydride form is preferred because it is more reactive. Aromatic dianhydrides are especially preferred as they give superior properties.

The diamine used in preparing the polyamic acid is also preferably aromatic. Examples of aromatic diamines include:

m-phenylenediamine (m-PDA);
p-phenylenediamine (p-PDA);
2,4-(TDA), 2,5- and 2,6-diaminotoluene;
p- and m-xylenediamine;
4,4'-diaminobiphenyl;
4,4'-diaminodiphenyl ether or 4,4'-oxydianiline; (ODA)
3,4'-oxydianiline;
4,4'-diaminobenzophenone;
3,3',3,4', or 4,4-diaminophenyl sulfone or m,m-, m,p- or p,p-sulfone dianiline;
4,4'-diaminodiphenyl sulfide;

3,3' or 4,4'-diaminodiphenylmethane or m,m- or p,p-methylene dianiline;
3,3'-dimethylbenzidine;
4,4'-isopropylidenedianiline;
1,4-bis(p-aminophenoxy)benzene;
1,3-bis(p-aminophenoxy)benzene;
4,4'-bis(4-aminophenoxy)biphenyl;
1,3-bis(3-aminophenoxy)benzene (APB);
2,4-diamine-5-chlorotoluene;
2,4-diamine-6-chlorotoluene;
2,2-bis-(4[4-aminophenoxy]phenyl) propane (BAPP);
trifluoromethyl-2,4-diaminobenzene;
trifluoromethyl-3,5-diaminobenzene;
2,2'-bis(4-aminophenyl)-hexafluoropropane;
2,2-bis(4-phenoxy aniline) isopropylidene;
2,4,6-trimethyl-,1,3-diaminobenzene;
4,4'-diamino-2,2'-trifluoromethyl diphenyloxide;
3,3'-diamino-5,5'-trifluoromethyl diphenyloxide;
4,4'-trifluoromethyl-2,2'-diamino biphenyl;
2,4,6-trimethyl-1,3-diaminobenzene;
diaminoanthraquinone;
4,4'-oxybis[(2-trifluoromethyl)benzeneamine](1,2,4-OBABTF);
4,4'-oxybis[(3-trifluoromethyl)benzeneamine];
4,4'-thiobis[(2-trifluoromethyl)benzeneamine];
4,4'-thiobis[(3-trifluoromethyl)benzeneamine];
4,4'-sulfoxylbis[(2-trifluoromethyl)benzeneamine];
4,4'-sulfoxylbis[(3-trifluoromethyl)benzeneamine];
4,4'-ketobis[(2-trifluoromethyl)benzeneamine];
4,4'-[(2,2,2-trifluoromethyl-1-(trifluoromethyl)ethylidine)bis(3-trifluoromethyl)benzeneamine];
4,4'-dimethylsilylbis[(3-trifluoromethyl)benzeneamine].

The preferred aromatic diamines are ODA, p-PDA, m-PDA, APB, and BAPP, due to the excellent properties of polyimides made from them.

A polyimidesiloxane can be prepared by using a mixture of a diamine that does not contain siloxane groups with a diamine that contains siloxane groups. Alternatively, a dianhydride that contains siloxane groups can be used to replace a portion of a dianhydride that does not contain siloxane groups. For example, a polyimidesiloxane can be made from about 1 to about 80 wt. % siloxane-containing monomers and about 20 to about 99 wt. % monomers that do not contain siloxane. Siloxane-containing polyimides are preferred because they have lower moisture absorption and better adhesion to substrates, and they preferably are made from about 1 to about 30 wt. % siloxane-containing monomers and about 70 to about 99 wt. % monomers that do not contain siloxane.

The siloxane-containing compounds may be either aromatic or non-aromatic, but non-aromatic compounds are preferred as they are more readily available. Examples of siloxane diamines that can be used include compounds having the formula

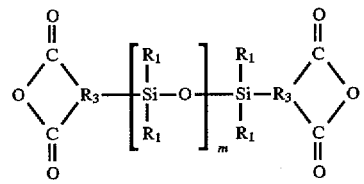

Examples of siloxane dianhydrides that can be used include compounds having the formula

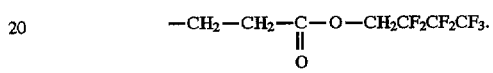

wherein $R_1$ and $R_2$, and $R_3$ are mono, di, and triradicals, respectively, each independently selected from a substituted or unsubstituted 1 to 12 carbon atom aliphatic group or a substituted or unsubstituted 6 to 10 carbon atom aromatic group, and m is 1 to 200 and is preferably 1 to 12. (Siloxane diamines are herein denoted by the notation "$G_m$".)
Examples of monoradicals include —$CH_3$, —$CF_3$, —$CH=CH_2$, —$(CH_2)_nCF_3$, —$C_6H_5$, —$CF_2$—$CHF$—$CF_3$, and $$-CH_2-CH_2-\underset{\underset{O}{\|}}{C}-O-CH_2CF_2CF_2CF_3.$$

Examples of diradicals include —$(CH_2)_n$—, —$(CF_2)_n$—, —$(CH_2)_n(CF_2)_n$—, and —$C_6H_4$—, where each n can be 1 to 10. Examples of triradicals include

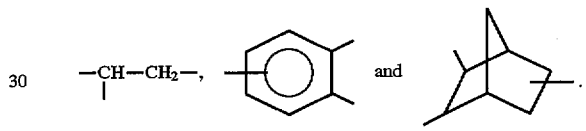

The monomers react at room temperature in a solvent to form a solution of the polyamic acid. The solvent must, of course, dissolve the polyamic acid. Suitable solvents depend upon the particular composition of the polyamic acid that is to be made and dissolved, but may include N-methylpyrrolidinone (NMP), diglyme, triglyme, cyclohexanone, cyclopentanone, dimethylacetamide, and mixtures of these solvents. The solvent preferably has a boiling point between 130° and 210° C. as lower boiling solvents may evaporate too readily from the film and higher boiling solvents may be too difficult to remove from the film. The solution of the polyamic acid in the solvent can be any percent solids desired, but it is preferably about 5 to about 30 wt. % solids as more dilute solutions mean more solvent to evaporate and more concentrated solutions are too viscous.

The polyamic acid can be up to about 40% imidized and it is preferably about 20 to about 40% imidized. A greater degree of imidization makes the polyamic acid too insoluble and less can make it too soluble during subsequent removal to form a pattern. Partial imidization can be accomplished by heating the solution of polyamic acid to about 100° to about 160° C. for about 5 minutes to about 2 hours.

The solution of the polyamic acid must contain about 1 to about 10 wt. %, based on polyamic acid weight, of a photosensitive system that becomes more soluble in the developer when exposed to actinic light. The photosensitive system may be, for example, a photosensitizer or a dissolution inhibitor and a photoactive compound. Photosensitizers that can be used can be found in European Patent 478321 A1 invented by M. Oba et al., p. 68–82, herein incorporated by reference. Examples of such photosensitizers include derivatives of 1,2 naphthoquinone (2)-diazido-4-sulfonate, 1,2 naphthoquinone (2)-diazido-5-sulfonate and azide compounds. The following are examples of positive photosensitizers:

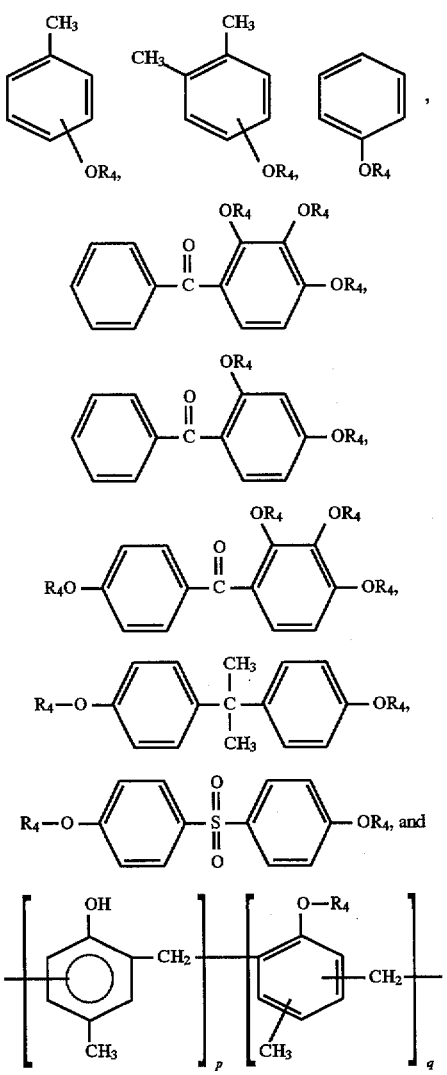

where p is 1 to 100, q is 1 to 100, and

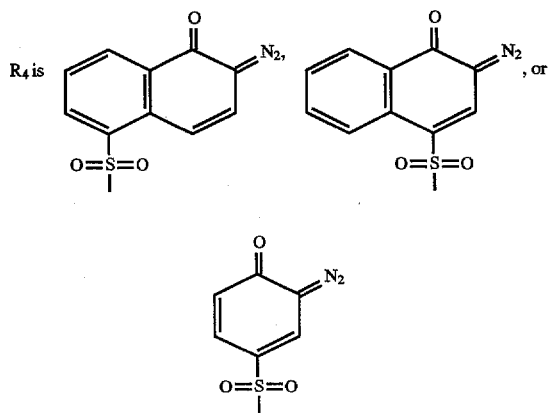

In general, when these photosensitizers are exposed to actinic or ultraviolet light, nitrogen is removed and the double bonded oxygen group is converted into the more water soluble carboxylic acid group. A preferred example of a positive photosensitizer is a derivative of 1,2-naphthoquinone-(2)-diazido-5-sulfonate which undergoes the following photoreaction by UV exposure:

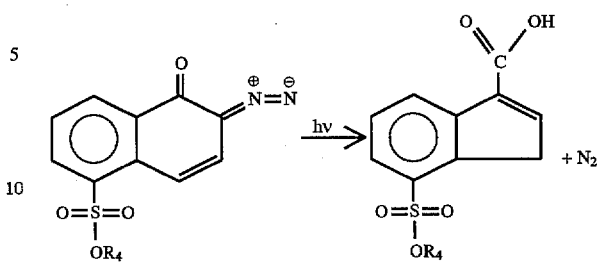

The preferred photosensitizer is 2,1,4 or 2,1,5-diazonaphthoquinone sulfonic esters. While this photosensitizer does not react with the partially imidized polyamic acid, it is initially insoluble in alkali water and its hydrophobicity prevents the partially imidized polyamic acid from dissolving in alkali water. However, when it is exposed to light it becomes soluble in the aqueous base developer and permits the dissolution of partially imidized polyamic acid with which it is in contact.

A photosensitive system of the partially imidized polyamic acid can also be prepared from dissolution inhibitors and photoactive compounds. The dissolution inhibitors contain an acid labile blocking group, such as t-butyl ester or a t-butyl carbonate. The photoactive compounds should generate a strong acid by UV irradiation and the strong protonic acid can deblock the acid labile groups during a subsequent postbake process. A positive image can be obtained by developing with aqueous base. The dissolution inhibitors are as follows:

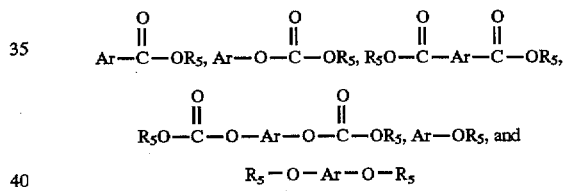

where Ar is aromatic or cycloaliphatic and $R_5$ is H or

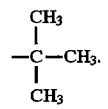

Examples of dissolution inhibitors include:

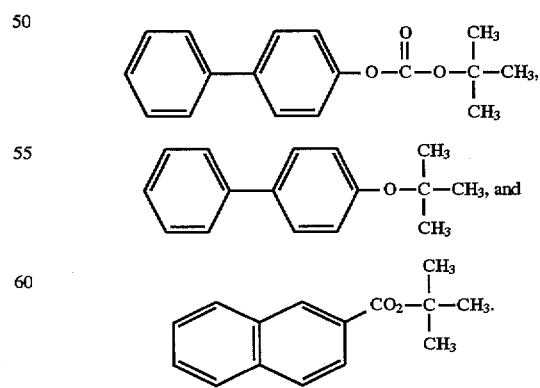

Examples of the photoactive compounds, which can produce a strong acid by UV exposure, include derivatives of 1,2-naphthoquinone-(2)-diazide-4-sulfonate, diaryl iodium salts, p-nitrobenzyl-9,10-diethoxyanthracene sulfonate, etc.

In the next step of the process of this invention, the solution of partially imidized polyamic acid containing the photosensitizer is applied to a substrate, forming a coating on the substrate. Suitable substrates include, for example, silicon wafers, copper, aluminum, silicon dioxide, and silicon nitride. The formation of the coating on the substrate can be accomplished by using a doctor blade, spin coating, or other means.

Solvent is then evaporated from the coating to form a solid coating. Evaporation of the solvent can be accomplished by heating on a hot plate or in an oven below the decomposition temperature of the photosensitizer. For example, if the solvent is N-methylpyrrolidone, heating can be at 100° to 150° C. Heating at this stage should remove most of the solvent but should result in very little imidization of the polyamic acid and very little decomposition of the photosensitizer.

In the next step, a layer of a positive photoresist is applied over the solid polyamic acid coating. The application of the positive photoresist can be accomplished by techniques well-known in the art, such as the use of a doctor blade or spin coating from solution and evaporation of the solvent. The photoresist should be sensitive to the same wavelength of light that the photosensitizer is sensitive to. Any type of positive photoresist can be used for this purpose. Suitable photoresists are commercially available products and can be purchased from Hoechst Celanese Corp., Olin Corp., Shipley Co., Tokyo Ohka Co., etc. The preferred photoresists are G-line or I-line sensitive and respond to UV light from 360 to 450 nm.

The layer of positive photoresist should be thick enough to protect the coating of polyamic acid beneath it during the dissolution step, but should be thin enough so that actinic light can pass through it into the polyamic acid coating beneath it. A thickness of about 0.5 to about 2 microns is usually suitable.

In the next step, the positive photoresist is exposed to a pattern of actinic or UV light for a time and intensity sufficient to pass through the layer of photoresist into the polyamic acid coating and activate the photosensitizer in the polyamic acid coating. A pattern of light can be formed using a mask, which can be applied using techniques well-known in the art. The UV light renders those portions of the photoresist layer and the polyamic acid coating that are exposed to the light more soluble in the developer.

The exposed portions of the layer of photoresist are removed using a developer appropriate for the particular photoresist selected. The exposed portions of the polyamic acid coating are then removed by dissolution in the same developer. A preferred aqueous developer is water containing 0.1 to 0.5 normal base. Preferably, the base is organic because inorganic bases, such as potassium hydroxide or sodium hydroxide, can leave behind low concentrations of sodium or potassium ions, which can adversely affect the dielectric properties of the resulting polyimide coating. Quaternary ammonium salts, such as tetramethyl ammonium hydroxide, tetraethyl ammonium hydroxide, tetrapropyl ammonium hydroxide, or tetrabutyl ammonium hydroxide, are preferred. Contact with the developer should be about 10 seconds to about 5 minutes, and preferably about 30 seconds to about 2 minutes, as longer times may attack unexposed areas and shorter times may leave exposed polyamic acid unremoved.

The remaining unexposed photoresist layer is then removed using an appropriate solvent. Finally, the polyamic acid coating remaining on the substrate is imidized, which can be accomplished by heating in stages, such as at 150° C. for 30 minutes followed by heating at 250° C. to 350° C. for 1 to 2 hours.

The following examples further illustrate this invention.

EXAMPLE 1

To a 500 ml 3-necked flask equipped with a mechanical stirrer, a Dean-Stark trap, a reflux condenser, and a thermometer was added 1188 ml dry NMP, followed by stirring 20.97 g (0.194 mole) p-PDA and 1.45 g (0.006 mole) diaminopropyl terminated dimethyl siloxane oligomer having an average repeat unit of 1 ($G_1$). After dissolving the diamines completely, 58.84 g (0.2 mole) BPDA was added at room temperature and the polymerization was run overnight. For the partial imidization, 264 ml toluene was added and mixed homogeneously. The temperature was raised to 145° C. and the mixture was refluxed for 5 minutes then cooled in an ice bath. The resin was precipitated in deionized water, filtered, washed in fresh deionized water or methanol again, and filtered. The filtered resin was dried at room temperature under a hood with slow air flow. The imidization measured by acid titration was 32.5%. The size of molecules in DMAC measured by gel phase chromatography (GPC) with polystyrene references was 6084 g/mole (Mn), 15780 g/mole (Mw), and 2.3 polydispersity.

EXAMPLE 2

The dry resin of Example 1 was dissolved in NMP at 28.6 wt. % and the solution was filtered through a 5 μm filter. A positive photosensitizer, ester of 1,2-naphthoquinone-(2)-diazide-5-sulfonic acid with p-cresol, (sold by Toyo Gosei Kogyo Co. as "PC-5"), 0.57 g, was added to the 10 g filtered solution and mixed for complete dissolution. The formulated solution was spin-coated on a silicon wafer at 2500 rpm for 40 seconds and soft-baked at 120° C. for 15 minutes in a convection oven. A positive photoresist, sold by Shipley Co. as Shipley Microposit® 1813 photoresist, was spin-coated onto the soft-baked wafer, then soft-baked again on a hot plate at 100° C. for 5 minutes. The coating was exposed to UV light through a mask for 3 seconds using a 350 watt mercury-xenon lamp. The UV exposed wafer was developed for 30 seconds in tetramethyl ammonium hydroxide (TMAH) developer, Shipley MF-312 CD-27.

After developing and drying the wafer, the photoresist was washed in ethyl acetate. The developed film was baked at 80°, 150°, 250°, and 350° C. for 30 minutes at each temperature. The pattern thickness was 5 μm and the SEM picture with a sharp profile pattern is shown in FIG. 1.

EXAMPLE 3

Figure 2:
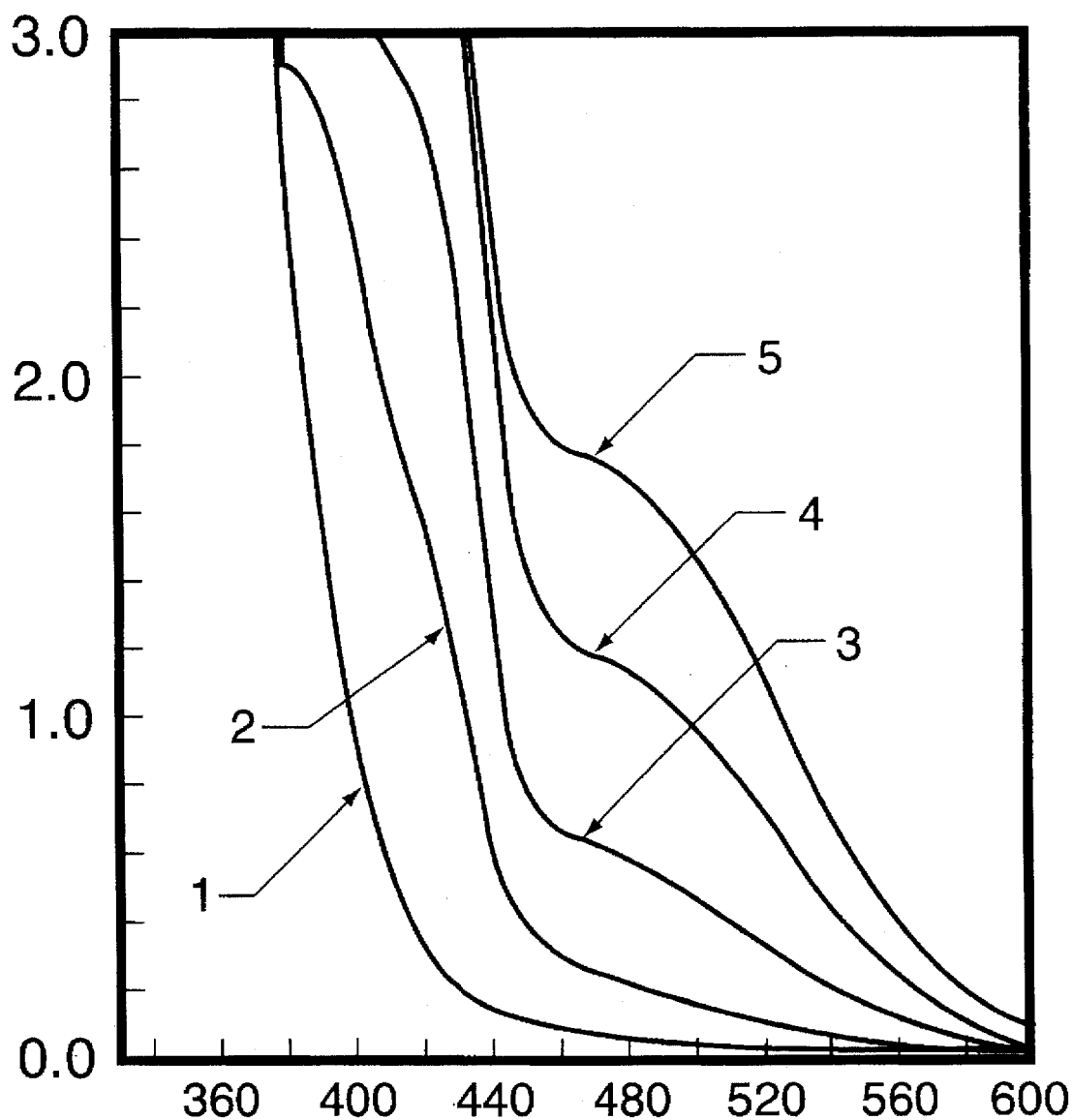
FIG. 2 is a graph showing the UV absorbance of five samples made in Example 2 at various UV wavelengths.
Figure 3:
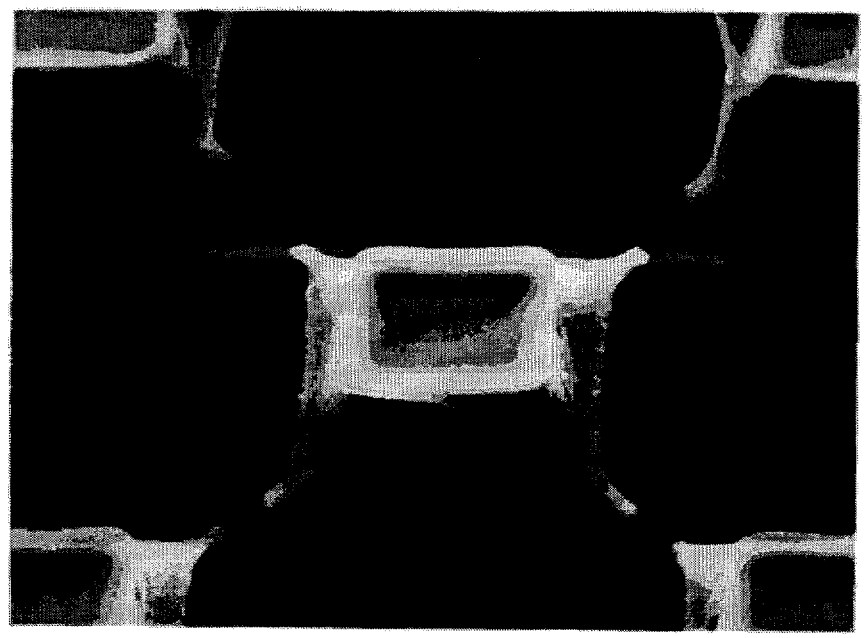
FIGS. 3 and 4 are photographs explained in Example 3 that show the degree of sidewall slope of polyimide coatings.
Figure 4:
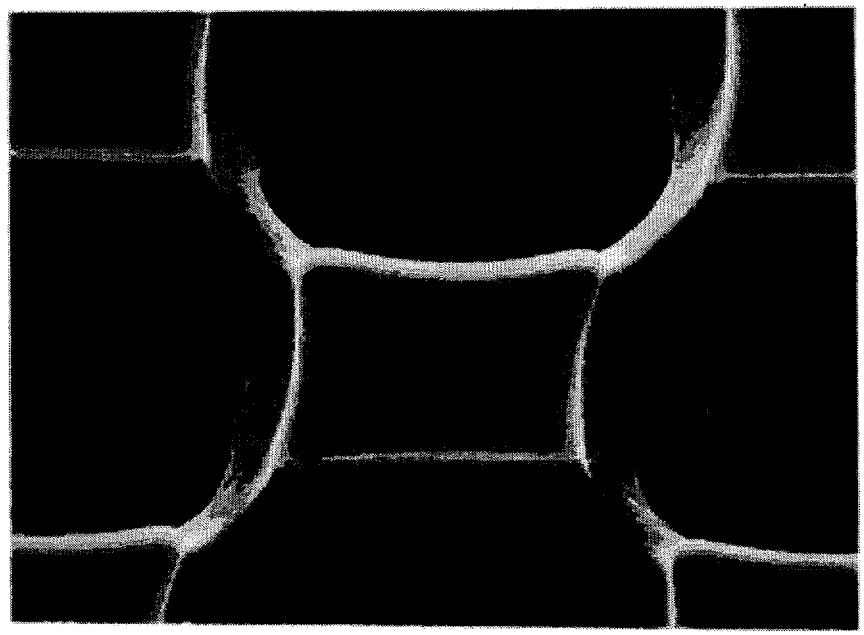

The dry resin of Example 1 was dissolved in NMP at a concentration of 28.5%. After this solution had been filtered through a 5 μm filter, samples 1 to 5 were prepared with 0, 5, 10, 15, and 20wt. % "PC-5" photosensitizer. The solutions were spin-coated on silicon wafers at 2000 rpm for 40 seconds and the coated wafers were soft-baked at 120° C. for 15 minutes in a convection oven. The positive photoresist, Shipley Microposit® 1813, was spin-coated on the soft-baked wafers at 2500 rpm for 40 seconds and then soft-baked again on a hot plate at 100° C. for 5 minutes. The wafers were exposed to UV light through a mask for 1 to 4 seconds with a 350 watt Hg-Xe lamp. UV spectra of the spin-coated films on quartz disks are shown in FIG. 2, where the ordinate is absorbance and the abscissa is wavelength in nm. The UV exposed wafers were developed in Shipley MF-312 CD-27 for about 20 seconds (but only about 15 seconds for the control, where no photosensitizer was used). After developing and drying of wafers, the photoresist on the precursors of polyimides was washed in acetone. When the remaining films were cured at 90°, 150°, 250°, and 350° C. for 30 minutes at each temperature, the final cured films were about 8 to 10 μm thick. From a comparison of SEM pictures of patterns obtained from the above samples (see FIGS. 3 and 4), it was established that the addition of the photosensitizer produced sharp edges, especially at the bottom layer of patterns. There is much more isotropic developing in FIG. 3, where no photosensitizer was used, than in FIG. 4, where 10 wt. % photosensitizer was used, even though the pattern in FIG. 4 was exposed to the developer for about 5 seconds longer.

EXAMPLE 4

To a 100 ml 3-necked flask with a mechanical stirrer, 55 g dry NMP was added, followed by 4.3 g (0.0213 mole) ODA and 0.16 g (0.00066 mole) $G_1$. After dissolving the diamines completely by stirring, 4 g (0.018 mole) PMDA and 1.18 g (0.00366 mole) BTDA were added and polymerized with stirring overnight at room temperature. One sample was used as prepared and another sample was formulated with 5% positive photosensitizer PC-5. Two solutions were spin-coated on silicon wafers at 1200 rpm for 40 seconds and soft-baked at 120° C. for 5 minutes in a convection oven. Then a positive photoresist, Shipley 1813, was spin-coated at 2000 rpm for 40 seconds and soft-baked at 100° C. for 3 minutes on a hot plate. The wafers were exposed to UV light through a mask for 1 to 4 seconds from a 350 watt Hg-Xe light source. The pure polyamic acid sample was developed for 10 to 18 seconds in TMAH developer and the profile of patterns had more severely sloped sidewalls than in Examples 2 and 3. The 5 wt. % PC-5 sample was developed in TMAH developer for 30 to 52 seconds.

We claim:

1. A method of making a polyimide pattern on a substrate comprising
    (A) preparing a solution in an organic solvent of a polyamic acid and about 1 to about 10 wt. % of a photosensitive system that becomes more soluble in an aqueous base developer when exposed to actinic light;
    (B) forming a coating of said solution on a substrate;
    (C) evaporating solvent from said coating;
    (D) applying a positive photoresist over said coating;
    (E) exposing said positive photoresist and said coating to a pattern of actinic light;
    (F) removing the exposed portions of said photoresist;
    (G) removing exposed portions of said coating by dissolution in an aqueous base developer;
    (H) removing remaining photoresist; and
    (I) imidizing polyamic acid coating remaining on said substrate.

2. A method according to claim 1 wherein said substrate is a silicon wafer.

3. A method according to claim 1 wherein said photosensitive system is 2,1,4 or 2,1,5-diazo naphthoquinone sulfonic esters.

4. A method according to claim 1 wherein said positive photoresist is sensitive to UV light having a wavelength from about 360 to about 450 nm.

5. A method according to claim 3 wherein said aqueous base developer is about 0.1 to about 0.5 normal aqueous solution of an organic base.

6. A method according to claim 5 wherein said organic base is a quaternary ammonium salt.

7. A method according to claim 5 wherein said quaternary ammonium salt is tetramethylammonium hydroxide.

8. A method according to claim 1 wherein said polyamic acid is about 20 to about 40% imidized.

9. A method according to claim 1 wherein said polyamic acid is the reaction product of an aromatic dianhydride and diamine, where about 70 to about 99 wt. % of said diamine is aromatic diamine that does not contain siloxane groups and about 1 to about 30 wt. % of said diamine is diamine that contains siloxane groups.

10. A method according to claim 9 wherein said dianhydride is selected from the group consisting of oxydiphthalic anhydride, 3,3'4,4'-bisphenyl tetracarboxylic dianhydride, 3,3'4,4'-benzophenone tetracarboxylic dianhydride, 2,2-bis (3,4-dicarboxyphenyl)hexafluoropropane dianhydride, and pyromellitic dianhydride, said aromatic diamine is selected from the group consisting of 4,4'-oxydianiline, m-phenylene diamine, p-phenylene diamine, 1,3-bis(3-aminophenoxy) benzene, and 2,2-bis(4-[4-aminophenoxy]phenyl)propane, and said diamine that contains siloxane groups has the formula

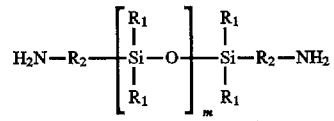

where $R_1$ and $R_2$ are mono and diradicals, respectively, each independently selected from a substituted or unsubstituted 1 to 12 carbon atom aliphatic group or a substituted or unsubstituted 6 to 10 carbon atom aromatic group and m is 1 to 200.

11. A method according to claim 1 wherein said photosensitive system is a mixture of dissolution inhibitors and photosensitive compounds.

12. A method according to claim 11 wherein said dissolution inhibitor is selected from the group consisting of

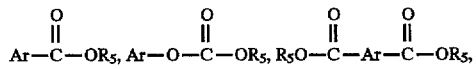

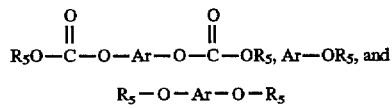

where Ar is aromatic or cycloaliphatic and $R_5$ is H or

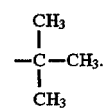

13. A method according to claim 11 wherein said photoactive compound is selected from the group consisting of derivatives of 1,2-naphthoquinone-(2)-diazide-4-sulfonate, diaryl iodium salts, p-nitrobenzyl-9,10-diethoxyanthracene sulfonate.

14. An article made according to the method of claim 1.

15. In a process for making a polyimide pattern on a substrate wherein a positive photoresist is applied to a coating of a polyamic acid on a substrate, the photoresist is exposed to a pattern of actinic light, and the exposed portions of the photoresist and the polyamic acid coating therebeneath are removed, an improvement which makes the sidewall of the pattern more vertical comprising mixing into said polyamic acid about 1 to about 10 wt. % of a photosensitive system that becomes more soluble in aqueous base when exposed to actinic light and removing said therebeneath polyamic acid coating using an aqueous medium.

16. A method according to claim 15 wherein said substrate is a silicon wafer.

17. A method according to claim 15 wherein said photosensitive system is 2,1,4 or 2,1,5-diazo naphthoquinone sulfonic esters.

18. A method of making a polyimidesiloxane pattern on a substrate comprising (A) preparing a solution in an organic solvent of
  (1) about 1 to about 10 wt. % of a photosensitizer that becomes more soluble in water after exposure to ultraviolet light; and
  (2) a polyamic acid that is the 1:2 to 2:1 molar reaction product of
    (a) aromatic dianhydride; and
    (b) diamine, where said diamine is about 70 to about 99 wt. % aromatic diamine that does not contain siloxane groups and about 1 to about 30 wt. % of a diamine that does contain siloxane groups;

(B) heating said solution to imidize about 20 to about 40% of the amic acid groups in said polyamic acid;

(C) forming a coating of said solution on a substrate;

(D) heating said coating to evaporate organic solvent therefrom and solidify said coating;

(E) applying a layer of a positive photoresist to said solidified coating;

(F) exposing said layer of positive photoresist and said underlying coating to a pattern of ultraviolet light;

(G) removing those portions of said positive photoresist that were exposed to ultraviolet light, thereby exposing the polyamic acid coating thereunder;

(H) removing said exposed polyamic acid coating using an aqueous developer;

(I) removing photoresist layer that remains on said polyamic acid coating; and (J) heating polyamic acid coating that remains on said substrate to a temperature sufficient to form polyimidesiloxane.

19. A method according to claim 18 wherein said substrate is a silicon wafer.

20. A method according to claim 18 wherein said aqueous developer is about 0.1 to about 0.5 normal tetramethylammonium hydroxide.

* * * * *